(12) United States Patent
Kawai (10) Patent No.: US 6,967,980 B2
(45) Date of Patent: Nov. 22, 2005

(54) OPTICAL SEMICONDUCTOR MODULE

(75) Inventor: Motoyoshi Kawai, Tokyo (JP)

(73) Assignee: NEC Corporation, Tokyo (JP)

( * ) Notice: Subject to any disclaimer, the term of this patent is extended or adjusted under 35 U.S.C. 154(b) by 43 days.

(21) Appl. No.: 10/119,302

(22) Filed: Apr. 10, 2002

(65) Prior Publication Data
US 2002/0150134 A1    Oct. 17, 2002

(30) Foreign Application Priority Data
Apr. 11, 2001  (JP)  ............... 2001-112571

(51) Int. Cl.$^7$ ............... H01S 5/00; H01S 3/20
(52) U.S. Cl. ............ 372/43.01; 372/50.1; 372/54
(58) Field of Search ............... 372/36, 43, 50, 372/54

(56) References Cited

U.S. PATENT DOCUMENTS

| 5,729,561 A | * | 3/1998 | Hironaka | ............... | 372/36 |
| 6,075,800 A | | 6/2000 | Spear | | |
| 6,212,212 B1 | * | 4/2001 | Honmou | ............... | 372/43 |
| 6,271,942 B1 | * | 8/2001 | Sasai et al. | ............... | 398/9 |
| 6,353,625 B1 | * | 3/2002 | Yoneda | ............... | 372/50 |
| 6,647,050 B2 | * | 11/2003 | Yuen et al. | ............... | 372/96 |

FOREIGN PATENT DOCUMENTS

| JP | 07-249798 | 9/1995 |
| JP | 09-051108 | 2/1997 |
| JP | 9-64479 | 3/1997 |
| JP | 11-068253 | 3/1999 |
| JP | 11-087849 | 3/1999 |
| JP | 11-220218 | 8/1999 |

OTHER PUBLICATIONS

European Search Report dated Jul. 7, 2004.
Japanese Office Action dated Mar. 25, 2005 with an English translation.

* cited by examiner

Primary Examiner—Minsun Oh Harvey
Assistant Examiner—Armando Rodriguez
(74) Attorney, Agent, or Firm—McGinn IP Law Group, PLLC (57) ABSTRACT

A semiconductor laser diode, in which an active layer is formed close to a bottom surface thereof, is fixed to a top surface of a substrate by means of solder layers in such a condition that the bottom surface of the semiconductor laser diode faces the top surface of the substrate, which is covered with a $SiO_2$ layer. The active layer is interposed between a pair of V grooves. The right and left solder layers partially fill a clearance formed between the bottom surface of the semiconductor laser diode and the top surface of the substrate, leaving a vacant space in the vicinity of the active layer and the V grooves. Accordingly, the distortion of and the residual stress exerted on the active layer can be decreed noticeably, so that the operation of an optical semiconductor module can be stabilized.

32 Claims, 7 Drawing Sheets

FIG. 7

OPTICAL SEMICONDUCTOR MODULE

FILED OF THE INVENTION

The invention relates to an optical semiconductor module on which a laser diode is mounted, and especially to an optical semiconductor module in which a semiconductor laser diode is fixed to a substrate by soldering.

The optical semiconductor module on which a laser diode is mounted is widely used as a light source in the field of the optical communication. Hitherto, in the most of the optical semiconductor modules with the aforementioned structure, the semiconductor laser diode is fixed to the substrate having the high heat conductivity, and an optical fiber is optically coupled with the optical semiconductor module by adjusting the position of the core of the optical fiber relative to the semiconductor laser diode.

Figure 1:
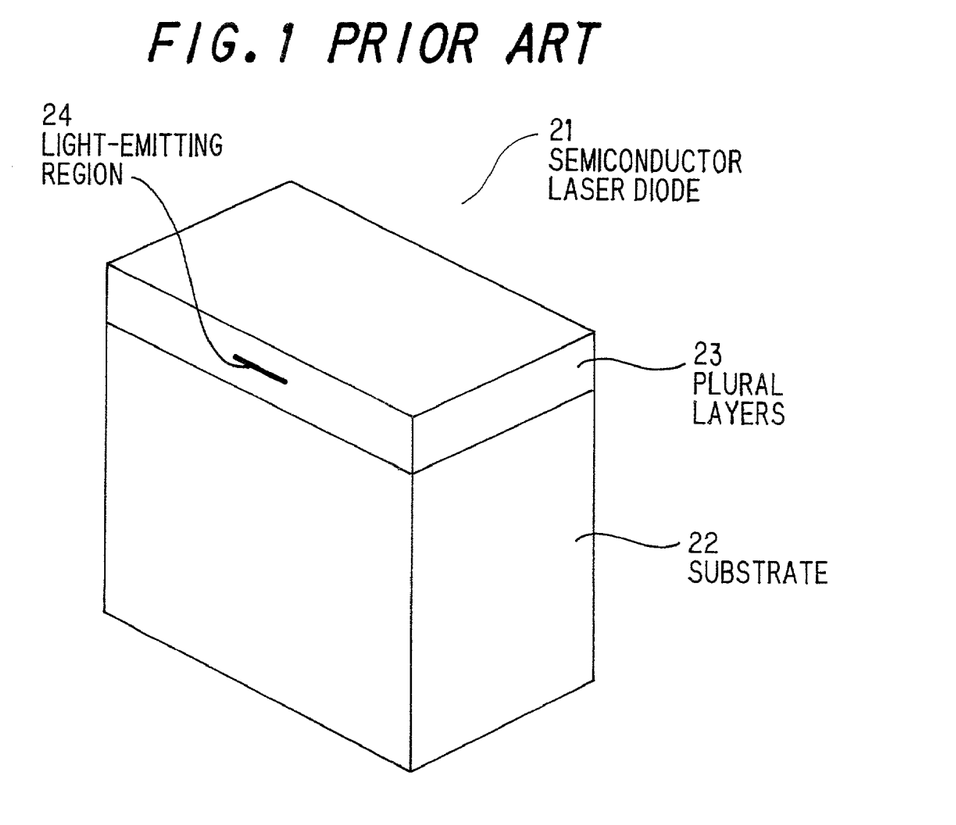
FIG. 1 is a perspective view for showing a structure of a conventional semiconductor laser diode.

FIG. 1 shows an outline of the structure of the conventional semiconductor laser diode. The semiconductor laser diode 21 of the distributed feedback type or the Fabry-Perot type is composed of a substrate 22 and plural layers 23 (shown as a single layer in FIG. 1 for simplicity) which are formed on the substrate 22 and includes an active layer for outputting laser light. The thickness of the plural layers 23 can be precisely controlled, because those are formed by the epitaxial growth. However, since the substrate 22 serving as a pedestal of the plural layers 23 is formed of InGaAs etc., and is processed by machining; the thickness of the substrate 22 is no so accurate as that of the plural layers 23.

Accordingly, if the substrate 22 of the semiconductor laser diode 21 is situated on the reference plane (not shown), it becomes difficult to adjust the core of the optical fiber (not shown), the position of which is determined based on the same reference plane, to the light-emitting region 24 formed in the plural layers 23.

Accordingly, a proposal that the semiconductor laser diode 21 is suited on the reference plane upside down compared with the state shown in FIG. 1 in order to make it easy to adjust the core of the optical fiber to the light-emitting region 24 of the semiconductor laser diode 21 is reported by Fujita and others in Proceedings of the 1995 IEICE Conference, SC-1-12.

Figure 2:
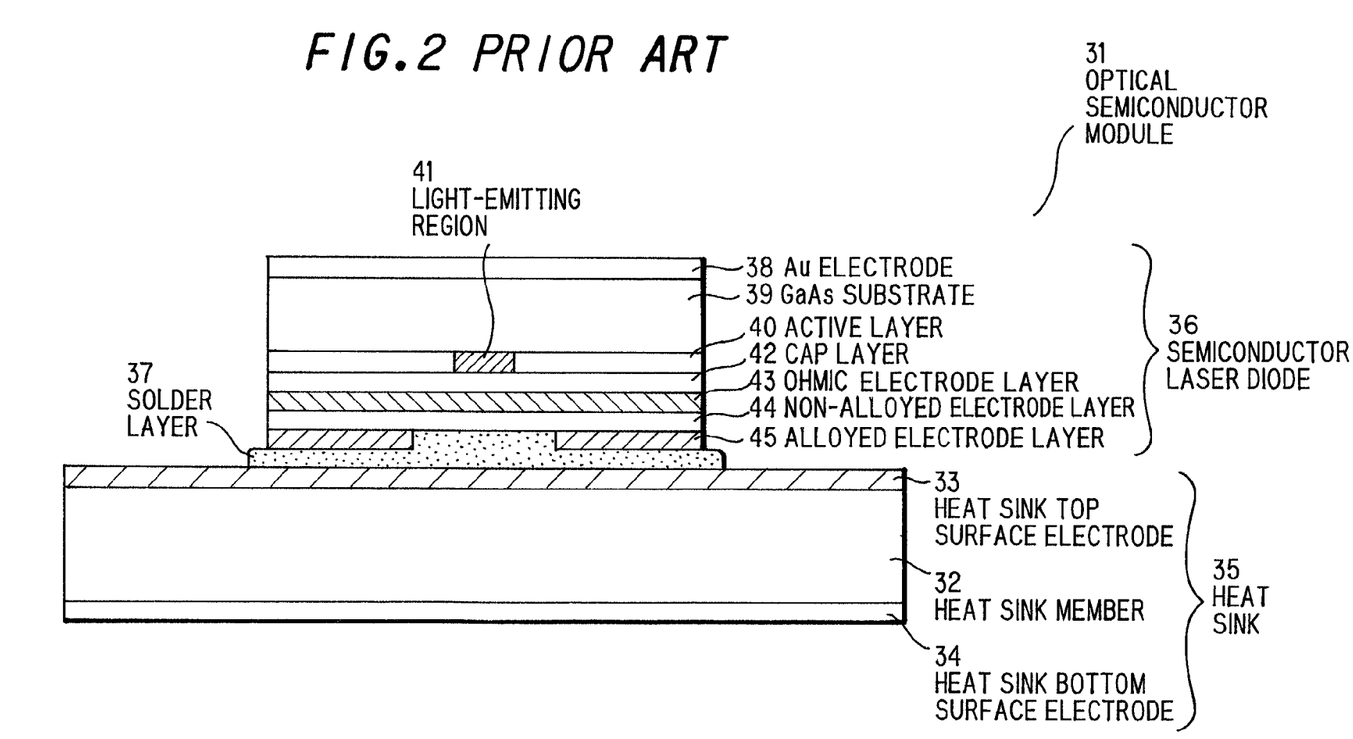
FIG. 2 is a cross-sectional view for showing an important part of a conventional optical semiconductor module disclosed in Japanese Patent Application, Laid-Open, H09-064479.

FIG. 2 shows an important part of the other example of such an optical semiconductor module, which is disclosed in Japanese Patent Applications, Laid-Open, H09-064479. In the Optical semiconductor module 31, a heat sink top surface electrode 33 is formed on the top surface of a heat sink member 32, and a heat sink bottom surface electrode 34 is formed on the bottom surface of the same. The heat sink top and bottom surface electrodes 33, 34, and the heat sink member 32 form a heat sink 35. A semiconductor laser diode 36 is mounted on the heat sink 35 by means of a solder layer 37 formed of AuSn. In the semiconductor laser diode 36 shown in FIG. 2, a GaAs substrate 39 serves as the basic material thereof, and the reverse surface of the GaAs substrate 39 is covered with an electrode 38 formed of Au. On the other obverse surface of the GaAs substrate 39, an active layer 40 having the light-emitting function is formed by the epitaxial growth, and a light-emitting region 41 is formed in the middle of the active layer 40. On the bottom surface of the active layer 40, a cap layer 42 is formed by the epitaxial growth; and an ohmic electrode layer 43, a non-alloyed electrode layer 44, and an alloyed electrode layer 45 are successively formed on the bottom surface of the cap layer 42, where the alloyed electrode layer 45 tightly adheres to the solder layer 37, because an alloy layer is formed therebetween.

Figure 3:
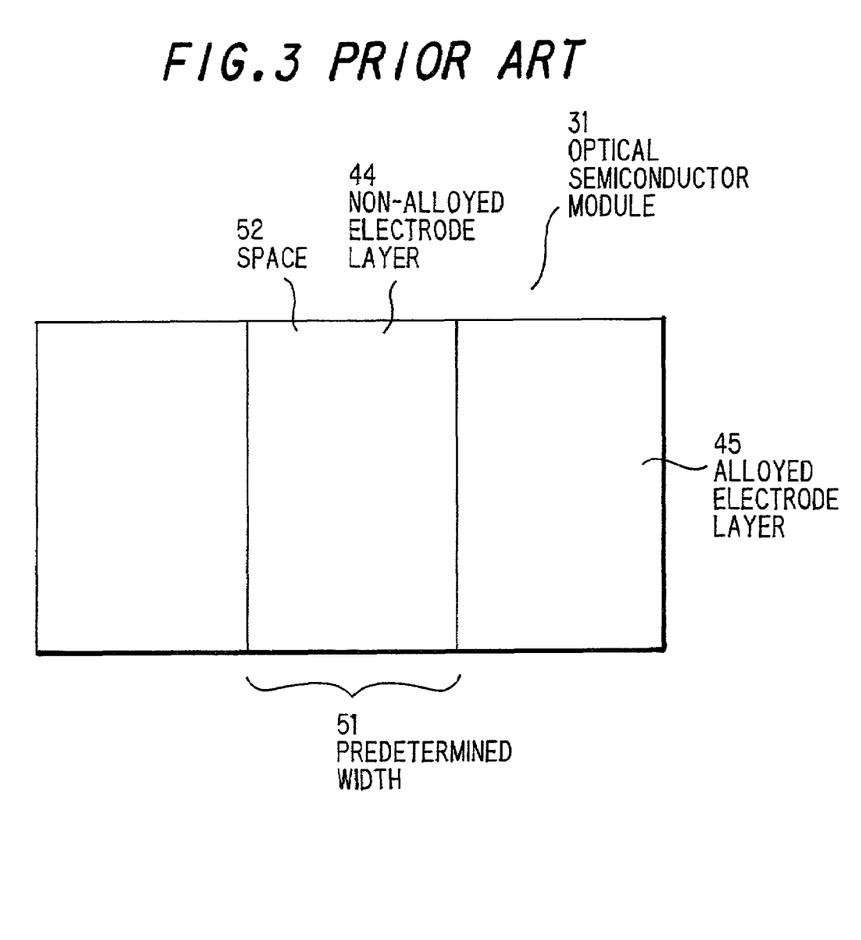
FIG. 3 is a bottom view of a semiconductor laser diode used in an optical semiconductor module shown in FIG. 2.

FIG. 3 shows a bottom view of the semiconductor laser diode 31, which is fixed to the top surface of the heat sink 35 by soldering. The alloyed electrode layer 45 is separated into two parts, which are arranged symmetrically with respect to the vertical bisector of the semiconductor laser diode 31, leaving a predetermined width 51 therebetween. The vertical bisector mentioned in the above coincides with a projection of the central axis of the light-emitting region 41. The solder layer 37 fits into a space 52 formed by the bottom surface of the non-alloyed electrode layer 44 and both the inner side edges of the alloyed electrode layer 45 separated into the two parts.

Moreover, in the optical semiconductor module mentioned in the above, there is a difference in the thermal expansion coefficient between the semiconductor laser diode and the heat sink or the Si substrate, to which the semiconductor laser diode is fixed by soldering. As a result, when the semiconductor laser diode is fixed to the substrate using AuSn solder having the high melting point, the distortion of or the residual stress exerted on the active layer cannot be disregarded. Accordingly, in the optical semiconductor module shown in FIGS. 2 to 3 or that reported in the Proc. Electron. Conf. IEICE '95, there arises a problem that light-emitting region 41 is deformed, and the quality of the laser light outputted therefrom is deteriorated.

Especially, in the semiconductor laser diode of the distributed feed back type, since the diffraction grating in the active layer, which is united with the light-emitting region 41, is deformed, and the refractive index of the active layer changes because of the stress exerted thereon; there arises the apprehension that the lasign wavelength of the laser light will shift from the intrinsic one to the other one on account of the change of the current or the ambient temperature, or the side mode level will increases, so that it becomes difficult to keep a stable operation based on the single mode. Particularly, in the proposal shown in FIGS. 2 to 3, since melted solder may flow into a domain situated just under the light-emitting region, there is a possibility that the aforementioned problems will be actualized.

Although the semiconductor laser diode of the Fabry-Perot type is not so seriously affected by the aforementioned problems, the quality of the laser light is deteriorated because of the deformation of mirrors forming the light emitting region 41 in common with the semiconductor laser diode of the distributed feedback type.

SUMMARY OF THE INVENTION

Accordingly, it is an object of the invention to provide an optical semiconductor module, in which a distortion of or a residual stress exerted on an active layer formed in a semiconductor laser diode can be minimized, when a bottom surface of a semiconductor diode overspreading an active layer is fixed to a top surface of a substrate by soldering.

According to the feature of the invention, an optical semiconductor module comprises:

a substrate, a semiconductor laser diode, a bottom surface of which faces a top surface of the substrate, the bottom surface closely overspreading an active layer formed in the semiconductor laser diode, and solder layers, which partially fill a clearance formed between the bottom surface of the semiconductor laser diode and the top surface of the substrate, leaving a vacant space formed in a vicinity of the active layer.

That is to say, since the solder layers are situated so that the vacant space is formed just under the active layer, when the semiconductor laser diode is fixed to the top surface of the substrate by soldering in such a condition that the bottom surface of the semiconductor laser diode faces the substrate, the effects of the distortion of and the residual stress exerted on the active layer can be minimized.

In the invention shown in claim 2, the semiconductor laser diode further comprises a pair of V grooves, which is formed on the bottom surface of the semiconductor laser diode, and runs outside the active layer in parallel thereto, wherein the vacant space extends to outside edges of the V grooves at least.

According to the aforementioned structure, the residual stress exerted on the active layer is further reduced by the pair of the V grooves.

In the invention shown in claim 4, the semiconductor laser diode is a one of a distributed feedback type.

That is to say, since the vacant space is formed between the solder layers and in the vicinity of the active layer, the distortion of the diffraction gratings formed in the active layer or the residual stress exerted on the active layer can be minimized. Moreover, the similar effect can be achieved when the ambient temperature suddenly changes.

In the invention shown in claim 5, the semiconductor laser diode is a one of the Fabry-Perot type.

That is to say, since the vacant space is formed between the solder layers and in the vicinity of the active layer, the distortion of the mirror and the discrepancy of the angles can be minimized. The similar effect can be achieved, when the ambient temperature suddenly changes.

In the invention shown in claim 6, the top surface of the substrate is provided with:

at least one electrode pattern to be electrically connected with the semiconductor laser diode by soldering, and at least one metallic pattern for mechanically fixing the semiconductor laser diode to the top surface of the substrate by soldering, wherein the at least one electrode pattern is insulated from the at least one metallic pattern, and composition of solder used in a step of electrically connecting the at least one electrode pattern with the semiconductor laser diode is different from that used in a step of mechanically fixing the semiconductor laser diode to the top surface of the substrate.

That is to say, since the electrode pattern to be electrically connected with the semiconductor laser diode is separated from the metallic patterns for fixing the semiconductor laser diode to the substrate mechanically; the area of the electrode pattern can be reduced, and the parasitic capacitances thereof can be decreased, so that the performance of the optical semiconductor module can be improved.

In the invention shown in claim 7, the electrode pattern is shaped into a long and narrow configuration.

Accordingly, the parasitic capacitances of the optical semiconductor module can be sufficiently reduced.

In the invention shown in claim 8, the optical semiconductor module further comprises a $SiO_2$ layer inserted between the electrode and metallic patterns and the top surface of the substrate.

That is to say, since the $SiO_2$ layer is formed on the top surface of the substrate, which is opposite to the active layer, melted solder is prevented from following into the vacant space formed just under the active layer, when the semiconductor laser diode is fixed to the substrate by soldering.

BRIEF DESCRIPTION OF DRAWINGS

The invention will be explained in more detail in conjunction with appended drawings, wherein.

DESCRIPTION OF PREFERRED EMBODIMENT

Hereafter, preferred embodiments of the invention will be explained in detail referring to the appended drawings.

[The First Preferred Embodiment]

Figure 4:
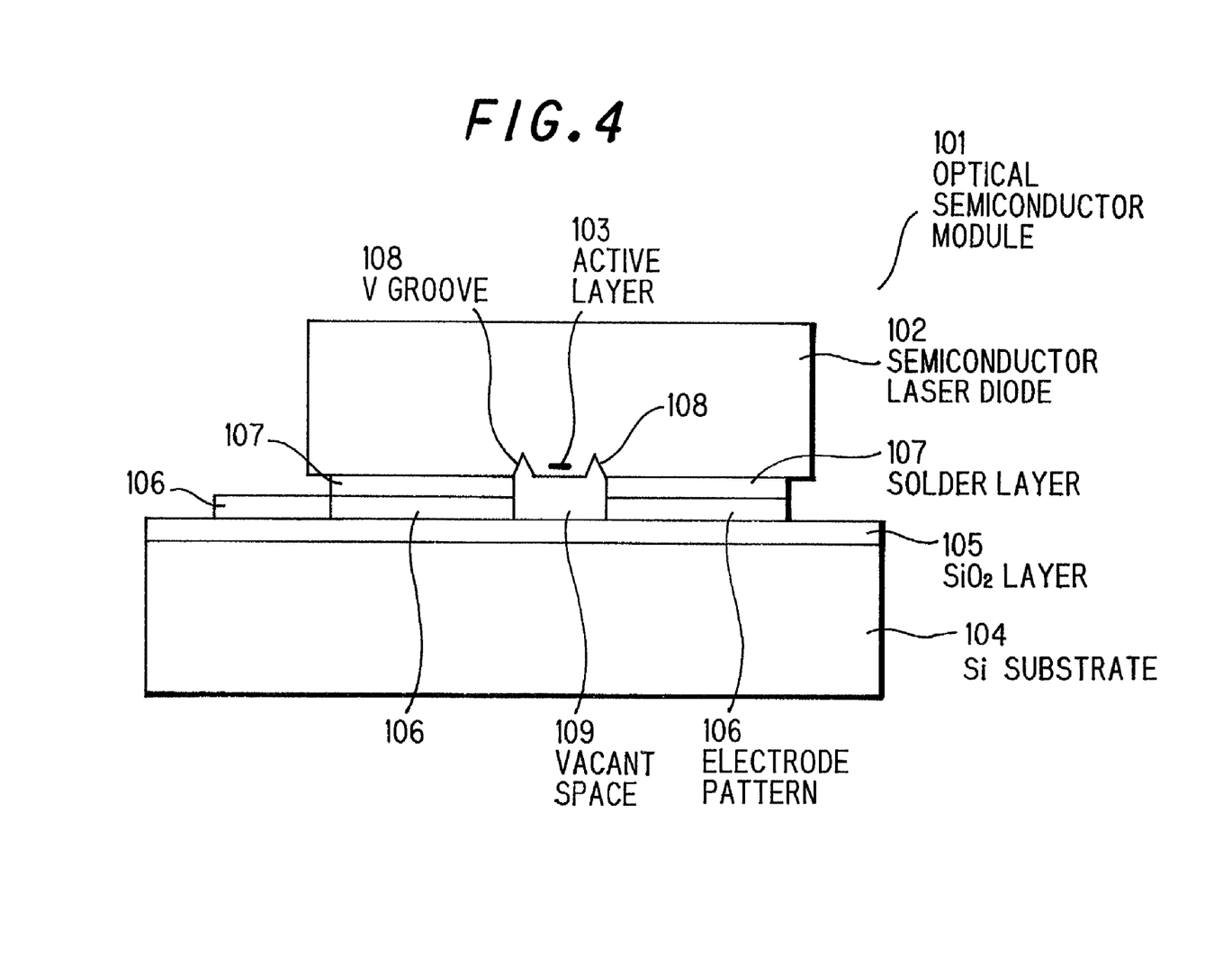
FIG. 4 is a side view for showing an important part of an optical semiconductor module according to the first preferred embodiment of the invention.

FIG. 4 shows an important part of an optical semiconductor module 101 according to the first preferred embodiment of the invention. In the optical semiconductor module 101, a semiconductor laser diode 102 of the distributed feedback type is mounted on a Si substrate 104 in such a condition that a bottom surface thereof, close to which an active layer 103 is formed, faces a $SiO_2$ layer 105 formed on a top surface of the Si substrate 104, and is fixed to electrode patterns 106 formed on the $SiO_2$ layer 105 by means of the right and left solder layers 107, which are formed of AuSn. Both the side edges of the active layer 103 are excised, and a pair of V grooves 108 is formed in parallel with the active layer 103. The right and left solder layers 107 are formed so as not to obstruct a space situated directly under the active layer 103 including the pair of the V grooves 108, so that a vacant space 109 is formed between the right and left solder layers 107.

Figure 5:
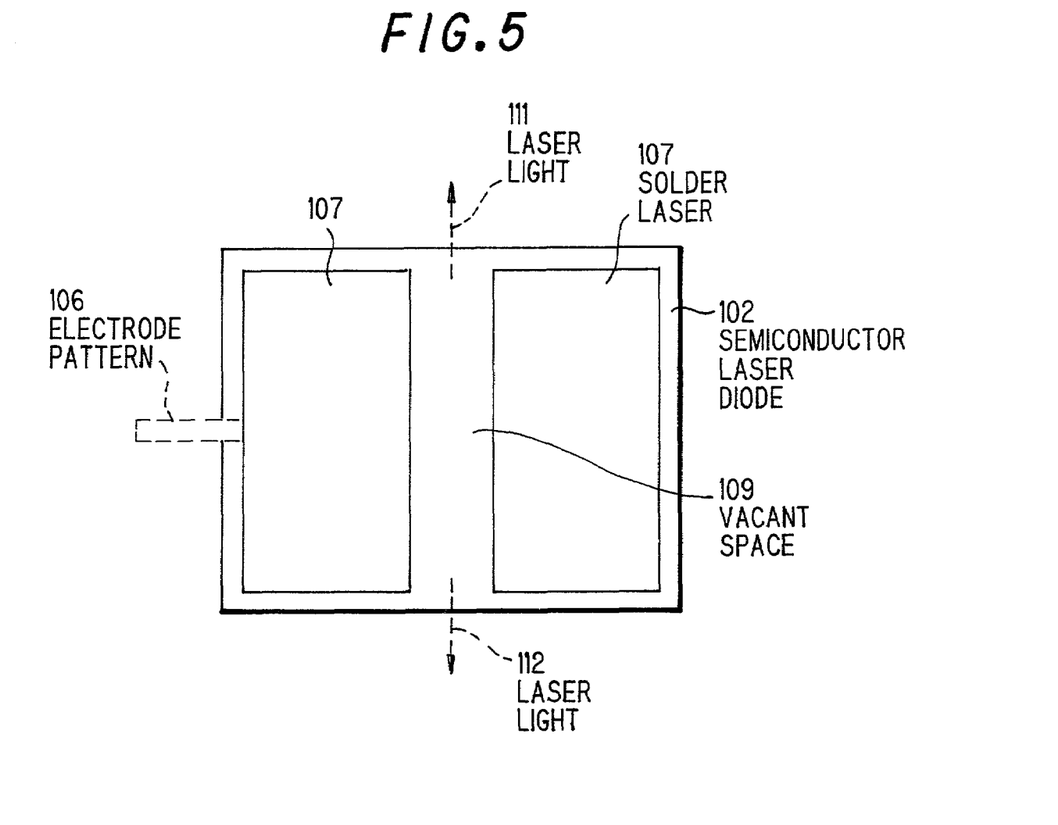
FIG. 5 is a bottom view of a semiconductor laser diode used in the first preferred embodiment of the invention.

FIG. 5 shows a bottom view of the semiconductor laser diode 102 in such a state that the solder layers 107 adhere to the bottom surface thereof. The solder layers 107 are opposite to each other, and the vacant space 109 is interposed therebetween. Laser lights 111, 112 are respectively outputted from the upper and lower ends of the vacant space 109. A dashed rectangular stretched out from the left end of FIG. 5 shows a part of the electrode pattern 106 for the reader's reference.

Next, a procedure for fixing the semiconductor laser diode 102 to the substrate 104 by soldering will be explained. Au and Sn layers are alternately stacked up on the electrode patterns 106 to form the solder layers 107. The semiconductor laser diode 102 is set on the solder layers 107 as shown in FIG. 4, and pressure is applied thereto. When the semi-fabricated optical semiconductor module shown in FIG. 4 is heated maintaining the aforementioned condition, the solder layers 107 are melted, and the semiconductor laser diode 102 is fixed to the electrode patterns 106 mechanically. At the same time, the semiconductor laser diode 102 of the distributed feedback type is connected with the electrode patterns 106 electrically. Since the solder layers 107 are thin, melted solder does not flow into the vacant space 109.

When the solder layers 107 are solidified, the distortion or the residual stress occurs in the optical semiconductor module 101 because of the difference in the thermal expansion coefficient between the semiconductor laser diode 102 and the Si substrate 104. However, since the solder layers 107 do not exist in the vicinity of the active layer 103, and the active layer 103 is interposed between the V grooves 108 parallel thereto; the distortion of or the residual stress exerted on the active layer 103 can be sharply reduced. As a result, the optical semiconductor module 101 provided with the laser diode 102 of the distributed feedback type can operate in a signal mode having the stable lasing wavelength.

Moreover, the optical semiconductor module 101 shows the stable operational characteristic, even when the ambient temperature changes sharply. Although there is the difference in the extent of the thermal expansion between the semiconductor laser diode 102 and the Si substrate 104 when the ambient temperature changes sharply as well as when the semiconductor laser 102 is fixed to the substrate 104 by soldering, the stress exerted on the active layer 103 is decreased for the same reason mentioned in the above. Accordingly, the operation of the optical semiconductor module in a single mode with the more stable lasing wavelength can be realized as compared with the conventional optical semiconductor module of the same kind.

[The Second Preferred Embodiment]

Figure 6:
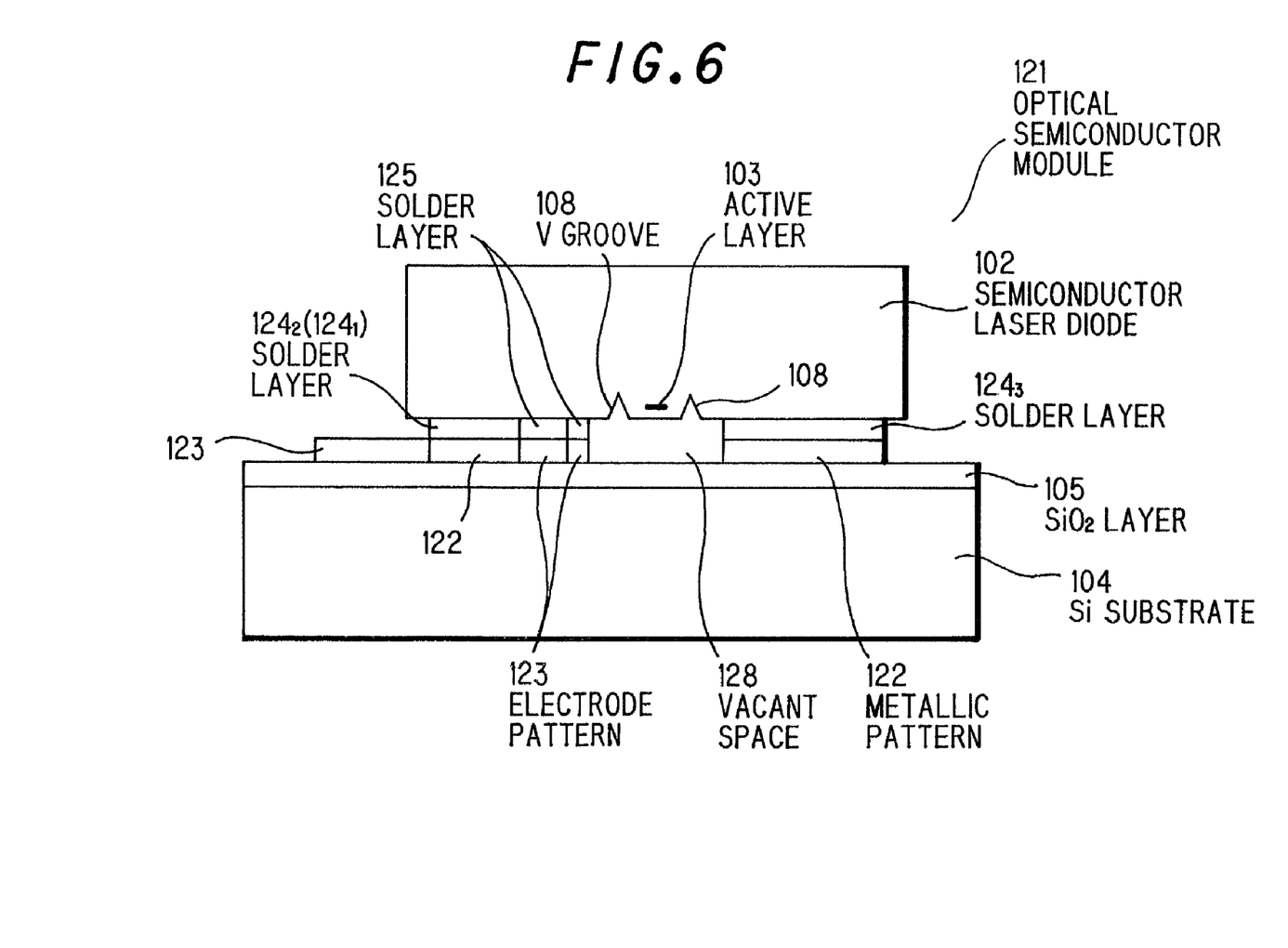
FIG. 6 is a side view for showing an important part of an optical semiconductor module according to the second preferred embodiment of the invention.
Figure 7:
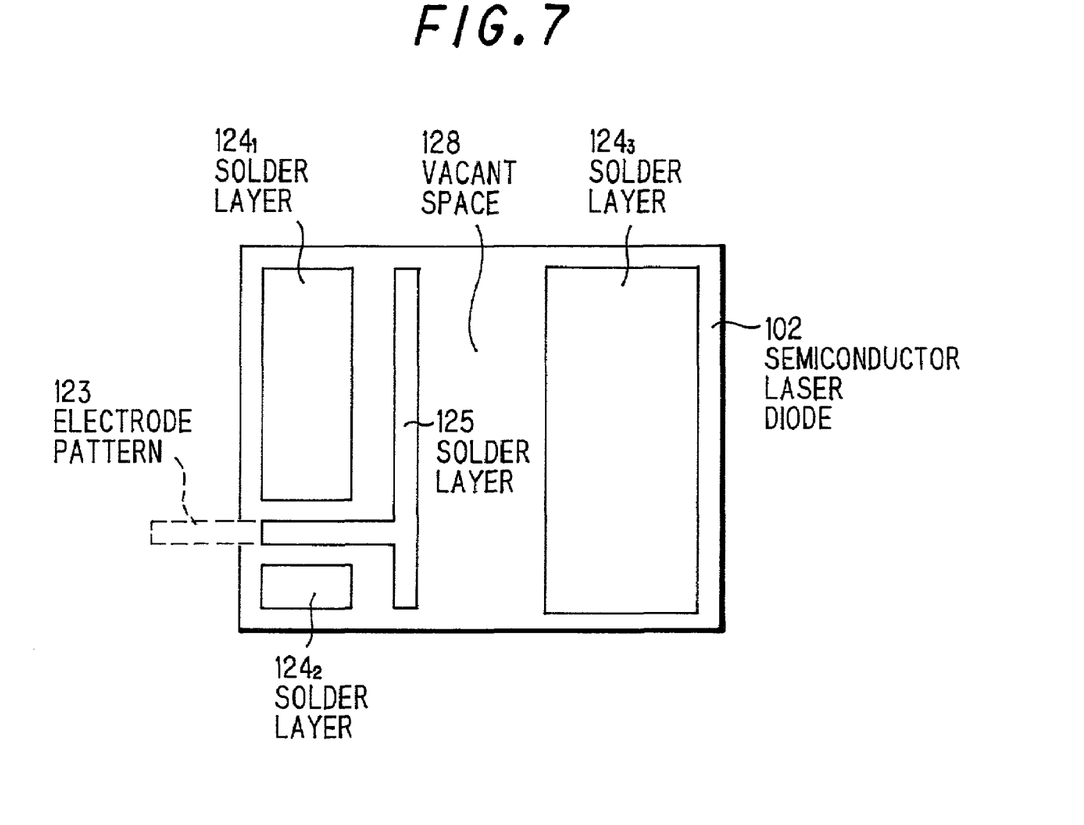
FIG. 7 is a bottom view of a semiconductor laser diode used in the second preferred embodiment of the invention.

FIG. 6 shows an important part of an optical semiconductor module according to the second preferred embodiment of the invention, and FIG. 7 shows a bottom view of a semiconductor laser diode in such state that solder lasers adhere to the bottom surface thereof. Since through FIG. 4 to FIG. 7, the structural elements having the same functions are denoted by the same reference numerals, detailed explanations thereon will be omitted. In the optical semiconductor module 121 according to the second preferred embodiment, a semiconductor laser diode 102 of the distributed feedback type is used similarly to the first preferred embodiment. Metallic patterns 122 for fixing the semiconductor laser diode 102 to the Si substrate 104 and an electrode pattern 123 to be connected with the semiconductor laser diode 102 are formed on a $SiO_2$ layer 105, which covers the top surface of the Si substrate 104. The solder layers $124_1$, $124_2$, $124_3$, which are formed of AuSn and fix the metallic patterns 122 to the semiconductor laser diode 102, are formed on the metallic patterns 122. The solder layer 125, which connects the electrode pattern 123 with the semiconductor laser diode 102, is formed on the electrode pattern 123. A vacant space 128 is formed between an active layer 103 of the semiconductor diode 102 and the Si substrate 104 covered with the $SiO_2$ layer 105, which is opposite to the active layer 103.

In the second preferred embodiment, clearances formed between the bottom surface of the semiconductor laser diode 102 and the metallic patterns 122 and the electrode pattern 123 are respectively filled with the solders layers $124_1$, $124_2$, $124_3$, 125. Since the method for fabricating the optical semiconductor module 121 according to the second preferred embodiment is the same as that according to the first preferred embodiment, the detailed explanation thereon will be omitted.

As mentioned in the above, in the optical semiconductor module 101 according to the first preferred embodiment, the solder layers 107 fix the semiconductor laser diode 102 to the Si substrate 104 mechanically, and, at the same time, connect the semiconductor laser diode 102 with the electrode patterns 106 electrically. In the optical semiconductor module 121 according to the second preferred embodiment, the electrode pattern 123 is separated from the metallic patterns 122 for fixing the semiconductor laser diode 102 to the $SiO_2$ layer 105 covering the top surface of the Si substrate 104 by soldering, and shaped into a long and narrow configuration in order to keep parasitic capacitances as small as possible. As a result, the metallic patterns 122 for fixing the semiconductor laser diode 102 to the $SiO_2$ layer 105 covering the top surface of the Si substrate 104 are formed on such areas that the vacant space 128 can be secured, the electrode pattern 123 is prevented from being brought into contact with the metallic patterns 122, and the sufficient mechanical strengths of the solder layers for fixing the semiconductor laser diode 102 to the $SiO_2$ layer 105 can be secured.

In the optical semiconductor module 121, the distortion of or the residual stress exerted on the active layer 103 caused by the solder layers 124, 125 is sharply reduced because of the existence of the vacant space 128 similarly to the first preferred embodiment. Moreover, since the area of the electrode pattern 123 is small, the optical semiconductor module 121 provided with the semiconductor laser diode 102 of the distributed feedback type can operate in a single mode having the stable lasing wavelength. Since the electrode pattern 123 and the solder layer 125, both of which establish the electric conduction between the semiconductor laser diode 102 and the external circuit jointly, also fulfill the function of fixing the semiconductor laser diode 102 to the Si substrate 104 mechanically; the mechanical strength of the optical semiconductor module 121 is further improved.

[Possibility of Modification of the Invention]

Although the semiconductor laser diode 102 of the distributed feedback type is used in the first and second preferred embodiments of the invention, the invention can be also applied to the optical semiconductor module using the semiconductor laser diode of the Fabry-Perot type mounted on the Si substrate or the heat sink. Although the simplified structures of the semiconductor laser diode 102 and the Si substrate 104 are shown in the explanations of the first and second preferred embodiments, metallic patterns or epitaxial layers of the other types may be suitably added to the structure of the optical semiconductor module.

In the second preferred embodiment, since the patterns fixed to the $SiO_2$ layer 105 are separated into the metallic patterns 122 for fixing the semiconductor laser diode 102 to the Si substrate 104 by soldering and the electrode pattern 123 to be electrically connected with the semiconductor laser diode 102; composition of the solder layers $124_1$, $124_2$, $124_3$ for fixing the semiconductor laser diode 102 to the metallic patterns 122 can be made different from that of the solder layers 125 for connecting the electrode patterns 123 with the semiconductor laser diode 102 in accordance with the functions of the solder layers.

Moreover, although a pair of the V grooves 108 are formed in parallel with both the side ends of the active layer 103 in order to reduce the residual stress exerted on the active layer 103 in the invention, the similar effect can be achieved by the other structure.

As mentioned in the above, according to the inventors shown in claim 1 to claim 7, since the solder layers are arranged so that the vacant space is formed in a region where the active layer faces the top surface of the Si substrate, when the semiconductor laser diode is fixed to the Si substrate by soldering in such a condition that the active layer is opposite to the the top surface of Si substrate, the effect of the distortion of or the residual stress exerted on the active layer can be minimized. Accordingly, the fluctuation of the qualities of the optical semiconductor module can be minimized, and the stable quality can be assured, even when the ambient temperature of the optical semiconductor module suddenly changes.

In the invention shown in claim 2, since the active layer is interposed between the pair of the V grooves formed in parallel with both the side ends of the active layers, the thermal stress exerted on the active layer can be further decreased.

In the invention shown in claim 4, since the vacant space is formed between the solder layers and in the vicinity of the active layer formed in the semiconductor laser diode of the distributed feedback type, the diffraction grating formed in the active layer is protected against the distortion of or the residual stress exerted on the active layer. The similar effect can be also achieved, when the ambient temperature sharply changes.

In the invention shown in claim 5, since the vacant space is formed between the solder layers and in the vicinity of the active layer formed in the semiconductor laser diode of the Fabry-Perot type, the distortion of the mirror or the discrepancy of the angle can be minimized, and the optical semiconductor module which operates stably in spite of the sudden change of the ambient temperature can be realized.

In the inventions shown in claims 6 and 7, since the electrode pattern to be electrically connected with the semiconductor laser diode is separated from the metallic patterns which fix the semiconductor laser diode to the substrate mechanically; the area of the electrode pattern can be reduced, and the parasitic capacitances of the electrode pattern can be reduced, so that the performance of the optical semiconductor module can improved.

In the invention shown in claim 8, since the SiO$_2$ layer is formed on the top surface of the substrate which is opposite to the active layer of the semiconductor laser diode; melted solder is prevented from flowing into the vacant space formed just under the active layer, the fabrication process can be promoted efficiently, and the stable quality of the optical semiconductor module can be secured.

What is claimed is:

1. An optical semiconductor module, comprising:
   a substrate,
   a semiconductor laser diode, a bottom surface of which faces a top surface of said substrate, said bottom surface closely overspreading an active layer formed in said semiconductor laser diode,
   an electrode pattern on said top surface defining a vacant space between the electrode pattern in a vicinity of said active layer, and
   solder layers, which partially fill a clearance formed between said bottom surface of said semiconductor laser diode and said electrode pattern, leaving said vacant space formed in a vicinity of said active layer vacant, wherein said vacant space extends above said bottom surface of said semiconductor laser diode.

2. An optical semiconductor module according to claim 1, further comprising:
   a pair of V grooves, which is formed on said bottom surface of said semiconductor laser diode, and runs outside said active layer in parallel thereto,
   wherein said vacant space extends to outside edges of said V grooves at least.

3. An optical semiconductor module according to claim 1, wherein:
   said substrate comprises Si.

4. An optical semiconductor module according to claim 1, wherein:
   said semiconductor laser diode comprises a distributed feedback type.

5. An optical semiconductor module, comprising:
   a substrate,
   a semiconductor laser diode, a bottom surface of which faces a top surface of said substrate, said bottom surface closely overspreading an active layer formed in said semiconductor laser diode, and
   solder layers, which partially fill a clearance formed between said bottom surface of said semiconductor laser diode and said top surface of said substrate, leaving a vacant space formed in a vicinity of said active layer vacant, wherein:
   said semiconductor laser diode comprises a Fabry-Perot type, and
   said vacant space extends above a bottom surface of said active layer.

6. An optical semiconductor module according to claim 1, further comprising a metallic pattern mechanically fixing said semiconductor laser diode to said top surface of said substrate by soldering,
   wherein said electrode pattern is insulated from said metallic pattern, and
   wherein said solder layers comprise a composition of solder used in a step of electrically connecting said electrode pattern with said semiconductor laser diode that is different from that used in a step of mechanically fixing said semiconductor laser diode to said top surface of said substrate.

7. An optical semiconductor module according to claim 6, wherein:
   said electrode pattern is shaped into a long and narrow configuration.

8. An optical semiconductor module according to claim 6, further comprising:
   a SiO$_2$ layer inserted between said electrode pattern and metallic patterns and said top surface of said substrate.

9. An optical semiconductor module, comprising:
   a substrate;
   an electrode pattern on a top surface of said substrate that defines a vacant portion;
   a solder layer on said electrode pattern and further defining said vacant portion; and
   a semiconductor laser diode having a bottom surface opposing said top surface and an active layer in a vicinity of said vacant portion which extends above said bottom surface.

10. The module of claim 9, wherein a bottom surface of said semiconductor laser diode includes a pair of V-shaped grooves.

11. The module of claim 10, wherein the active layer is disposed between said V-shaped grooves.

12. The module of claim 10, wherein said pair of V-shaped grooves extend to outside edges of said vacant portion.

13. The module of claim 9, wherein said substrate comprises Si.

14. The module of claim 9, wherein said semiconductor laser diode comprises a distributed feedback type.

15. The module of claim 9, wherein said semiconductor laser diode comprises a Fabry-Perot type.

16. An optical semiconductor module comprising:
a substrate;
an electrode pattern on a top surface of said substrate;
a metallic pattern on a top surface of said substrate, wherein said electrode pattern and said metallic pattern define a vacant portion;
a solder layer on said electrode pattern and said metallic pattern and further defining said vacant portion; and
a semiconductor laser diode having an active layer in a vicinity of said vacant portion.

17. The module of claim 16, wherein said electrode pattern is insulated from said metallic pattern.

18. The module of claim 16, wherein said solder layer comprises a first type of solder on said electrode pattern and a second type of solder on said metallic pattern, which is different from the first type of solder.

19. The module of claim 16, wherein said electrode pattern is elongated and has a predetermined narrow width.

20. The module of claim 1, wherein said vacant space that extends above said bottom surface is horizontally spaced from side edges of said active layer.

21. The module of claim 20, wherein said vacant space horizontally spaced from side edges of said active layer comprises at least one V-shaped groove.

22. The module of claim 5, wherein said vacant space that extends above said bottom surface of said active layer is horizontally spaced from side edges of said active layer.

23. The module of claim 22, wherein said vacant space horizontally spaced from side edges of said active layer comprises at least one V-shaped groove.

24. The module of claim 9, wherein said vacant space that extends above said bottom surface is horizontally spaced from side edges of said active layer.

25. The module of claim 24, wherein said vacant space horizontally spaced from side edges of said active layer comprises at least one V-shaped groove.

26. The module of claim 16, wherein said vacant space extends above a bottom surface of the semiconductor laser diode and is horizontally spaced from side edges of said active layer.

27. The module of claim 26, wherein said vacant space horizontally spaced from side edges of said active layer comprises at least one V-shaped groove.

28. A method for making an optical semiconductor module, comprising:
providing a substrate,
providing a semiconductor laser diode, a bottom surface of which faces a top surface of said substrate, said bottom surface closely overspreading an active layer formed in said semiconductor laser diode,
providing an electrode pattern on said top surface defining a vacant space between the electrode pattern in a vicinity of said active layer, and
providing solder layers, which partially fill a clearance formed between said bottom surface of said semiconductor laser diode and said electrode pattern, leaving said vacant space formed in a vicinity of said active layer vacant, wherein said vacant space extends above said bottom surface of said semiconductor laser diode.

29. The optical semiconductor module of claim 5, further comprising a $SiO_2$ layer on a top surface of said substrate.

30. The optical semiconductor module of claim 29, wherein said bottom surface of said semiconductor laser diode faces a top surface of said $SiO_2$ layer.

31. The optical semiconductor module of claim 30, further comprising an electrode pattern on a top surface of said $SiO_2$ layer.

32. The optical semiconductor module of claim 31, wherein said vacant space is defined by said electrode pattern, said solder layers, said top surface of said $SiO_2$ layer, and said bottom surface of said semiconductor laser diode.

* * * * *